(12) United States Patent
Epler et al.

(10) Patent No.: US 6,956,246 B1
(45) Date of Patent: Oct. 18, 2005

(54) RESONANT CAVITY III-NITRIDE LIGHT EMITTING DEVICES FABRICATED BY GROWTH SUBSTRATE REMOVAL

(75) Inventors: John E. Epler, Milpitas, CA (US); Michael R. Krames, Mountain View, CA (US); Jonathan J. Wierer, Jr., Fremont, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/861,745

(22) Filed: Jun. 3, 2004

(51) Int. Cl.[7] .............................................. H01L 33/00
(52) U.S. Cl. ........................... 257/94; 257/96; 257/98; 257/103
(58) Field of Search ............................. 257/13, 79, 94, 257/96, 98, 103; 372/45, 46, 50

(56) References Cited

U.S. PATENT DOCUMENTS

| | | |
|---|---|---|
| 5,390,210 A | 2/1995 | Fouquet et al. |
| 5,838,707 A | 11/1998 | Ramdani et al. |
| 5,862,167 A | 1/1999 | Sassa et al. |
| 5,985,687 A | 11/1999 | Bowers et al. |
| 6,071,795 A | 6/2000 | Cheung et al. |
| 6,111,272 A | 8/2000 | Heinen |
| 6,113,685 A | 9/2000 | Wang et al. |
| 6,177,359 B1 | 1/2001 | Chen et al. |
| 6,280,523 B1 | 8/2001 | Coman et al. |
| 6,320,206 B1 | 11/2001 | Coman et al. |
| 6,559,075 B1 | 5/2003 | Kelly et al. |
| 2003/0222263 A1 | 12/2003 | Choi |

FOREIGN PATENT DOCUMENTS

EP    1 385 215 A2    1/2004

OTHER PUBLICATIONS

P.A. Kohl, "Photoelectrochemical etching of semiconductors", IBM J. Res. Develop., vol. 42, No. 5, Sep. 5, 1998, pp. 629-637.

Chen-Fu Chu et al., "Comparison of p-Side Down and p-Side Up GaN Light-Emitting Diodes Fabricated by Laser Lift-Off", Jpn. J. Appl. Phys., vol. 42 (2003), Part 2, NO. 2B, Feb. 15, 2003, pp. L147-L150.

W.S. Wong et al., "InxGa1-xN light emitting diodes on Si substrates fabricated by Pd-In metal bonding and laser lift-off", Applied Physics Letters, vol. 77, No. 18, Oct. 30, 2000, pp. 2822-2824.

H. Benisty et al., "Impact of Planar Microcavity Effects on Light Extraction—Part I: Basic Concepts and Analytical Trends", IEEE Journal of Quantum Electronics, vol. 34, No. 9, Sep. 1998, pp. 1612-1631.

T. Fujii et al., "Increase in the extraction efficiency of GaN-based light-emitting diodes via surface roughening", Applied Physics Letters, vol. 84, No. 6, Feb. 9, 2004, pp. 855-857.

Y.-K. Song et al., "Resonant-cavity InGaN quantum-well blue light-emitting diodes", Applied Physics Letters, vol. 77, No. 12, Sep. 18, 2000, pp. 1744-1746.

*Primary Examiner*—Thien F. Tran
(74) *Attorney, Agent, or Firm*—Rachel V. Leiterman; Patent Law Group LLP

(57) ABSTRACT

A semiconductor light emitting device includes an n-type region, a p-type region, and light emitting region disposed between the n- and p-type regions. The n-type, p-type, and light emitting regions form a cavity having a top surface and a bottom surface. Both the top surface and the bottom surface of the cavity may have a rough surface. For example, the surface may have a plurality of peaks separated by a plurality of valleys. In some embodiments, the thickness of the cavity is kept constant by incorporating an etch-stop layer into the device, then thinning the layers of the device by a process that terminates on the etch-stop layer.

25 Claims, 8 Drawing Sheets

RESONANT CAVITY III-NITRIDE LIGHT EMITTING DEVICES FABRICATED BY GROWTH SUBSTRATE REMOVAL

BACKGROUND

1. Field of Invention

The present invention relates to III-nitride semiconductor light emitting devices.

2. Description of Related Art

Semiconductor light-emitting devices including light emitting diodes (LEDs) are among the most efficient light sources currently available. Materials systems currently of interest in the manufacture of high-brightness light emitting devices capable of operation across the visible spectrum include Group III–V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. Sapphire is often used as the growth substrate due to its wide commercial availability and relative ease of use. The stack grown on the growth substrate typically includes one or more n-type layers doped with, for example, Si, formed over the substrate, a light emitting or active region formed over the n-type layer or layers, and one or more p-type layers doped with, for example, Mg, formed over the active region.

Since sapphire is not conductive, contacts to both the p- and n-sides of the active region must be formed on the top side of the device, requiring that a portion of the active region and p-type region be etched away to expose a portion of the buried n-type region. The device is thus a non-planar surface with narrow insulating blocking layers separating the n- and p-contacts, a geometry that is difficult to package. Also, much of the area of the active region is lost to the n-contact and insulating regions, providing a poor fill factor.

U.S. Pat. No. 6,280,523 describes a III-nitride device formed by removing the growth substrate. The epitaxial stack is wafer bonded to a host substrate of GaP, GaAs, InP, or Si. The growth substrate is then removed by laser melting, wet chemical etching, or selective etching of a sacrificial layer. Removing the growth substrate permits the active region to be disposed between two dielectric distributed Bragg reflectors, in order to form a resonant cavity device. The use of a resonant cavity may increase control of the direction of emitted light, increase the amount of light extracted from the device, and increase the spectral purity of the light emitted normal to the device.

Needed in the art are improved III-nitride resonant cavity structures.

SUMMARY

In accordance with embodiments of the invention, a semiconductor light emitting device includes an n-type region, a p-type region, and light emitting region disposed between the n- and p-type regions. The n-type, p-type, and light emitting regions form a cavity having a top surface and a bottom surface. Both the top surface and the bottom surface of the cavity may have a rough surface. For example, the surface may have a plurality of peaks separated by a plurality of valleys. In some embodiments, the thickness of the cavity is kept constant by incorporating an etch-stop layer into the device, then thinning the layers of the device by a process that terminates on the etch-stop layer.

DETAILED DESCRIPTION

In accordance with embodiments of the invention, improved III-nitride resonant cavity devices are provided. A constant cavity thickness is created by incorporating an etch stop layer during growth. In some embodiments of the invention, trenches are formed on the device to increase light extraction. In some embodiments, grid contacts are provided.

Figure 1:
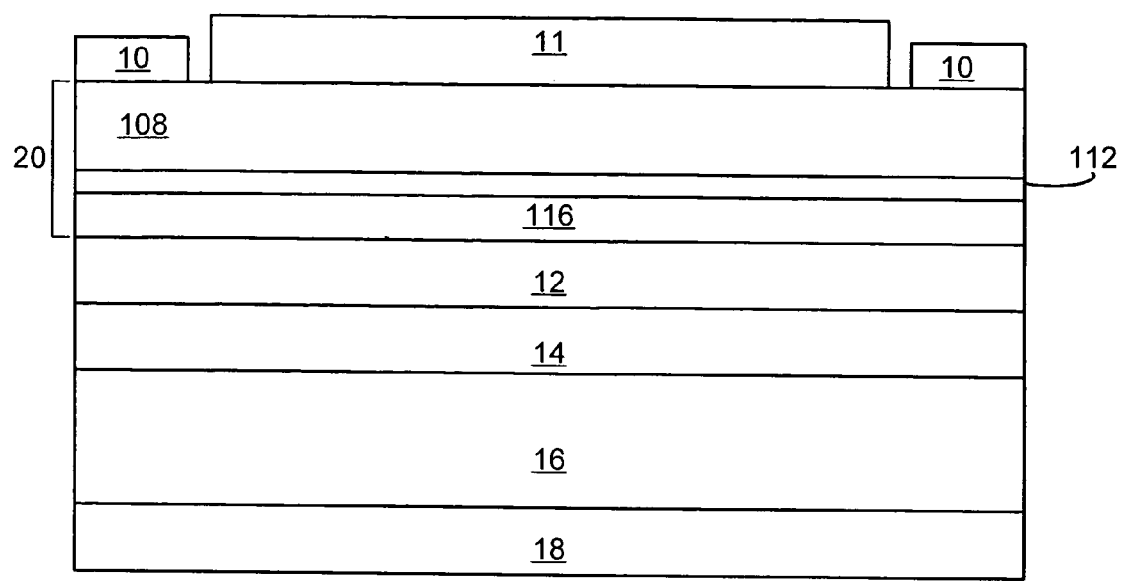
FIGS. 1 and 2 are a cross-sectional view and a plan view of a light emitting device according to embodiments of the present invention.
Figure 2:
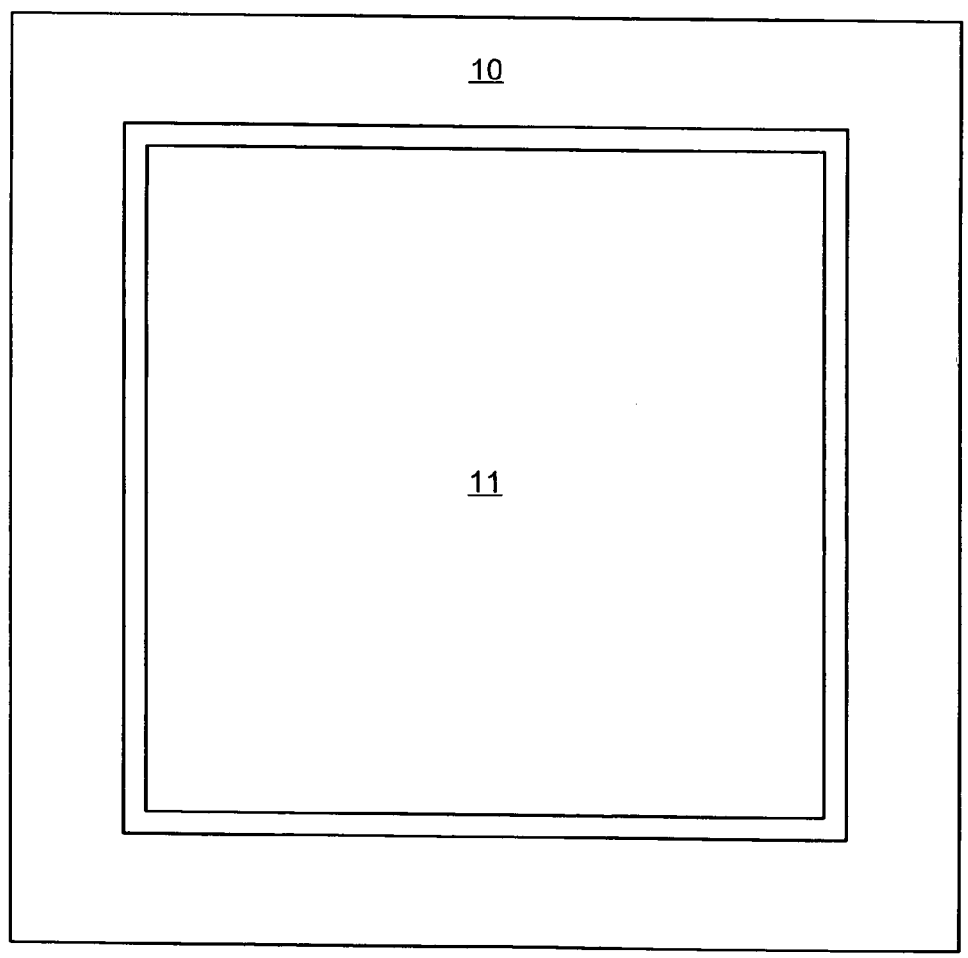

FIGS. 1 and 2 are cross sectional and plan views of a resonant cavity III-nitride device according to embodiments of the invention. An active region 112 is sandwiched between an n-type region 108 and a p-type region 116. The embodiment of FIGS. 1 and 2 shows an n-contact 10 formed on a portion of n-type region 108 not covered by DBR 11, through which light is extracted from the device. A reflective p-contact 12 is formed on p-type region 116. P-contact 12 connects the epitaxial layers 20 to a host substrate 16 either directly or via optional bonding layers 14. Host substrate 16 may be a semiconductor, requiring ohmic contacts 18 on the surface of host substrate. In some embodiments of the invention, the device illustrated in FIGS. 1 and 2 is a large junction device, meaning that the device has an area of at least 200×200 $\mu m^2$ and operates at a current density of at least 100 A/cm$^2$.

N-contact 10 may surround the extraction surface, as illustrated in FIG. 2, or may have an alternative configuration. The pattern of contacts may be chosen such that the largest distance between any point on p-contact 12 and n-contact 10 is less than the maximum current spreading distance characteristic of the particular device. The maximum current spreading distance may range from, for example, about 20 μm to about 250 μm. Increasing the electrical conductivity increases the spreading distance. Decreasing the epitaxial stack thickness decreases the spreading distance. In some embodiments, current is blocked from the p-type region 116 in the area under n-contact 10, in order to force current into the cavity formed by DBR 11 and reflective p-contact 12. Current blocking may be accomplished by implanting the areas of p-type region 116 under n-contact 10 with $H^+$ at, for example, an energy of 10 keV and a dose of $2\times10^{14}$ $cm^2$, to create highly resistive regions. Alternatively, the areas to be blocked may be covered with a non-ohmic metal such as Ti or an insulator such as an oxide or a nitride of silicon.

The distance between the reflective p-contact and the active region may be selected to maximize extraction from the device. Generally the electric field intensity in the cavity forms a standing wave. The center of the active region may be located near a maximum in the electric field intensity. Conversely, any absorbing structures, such as, for example, highly doped layers of a tunnel junction, are preferably located a minima in the field intensity. Calculation of the optimal separation between the reflective p-contact and the active region is analogous to the calculations described in more detail in U.S. application Ser. No. 10/158,360, titled "Selective Placement Of Quantum Wells In Flip-Chip Light Emitting Diodes For Improved Light Extraction" and incorporated herein by reference.

The resonant cavity is formed by DBR 11 and a reflective layer opposite the p-type region from the DBR; typically p-contact 12, though the reflective layer may be optional bonding layers 14, or host substrate 16. The resonant cavity offers superior control of the light. As described in "Impact of Planar Microcavity Effects on Light Extraction—Part I: Basic Concepts and Analytical Trends," H Benisty, H. De Neve, and C. Weisbuch, IEEE Journal Of Quantum Electronics, Vol. 34, No. 9, September 1998, pp. 1612–1631, the resonant cavity offers potentially a higher internal efficiency, a higher extraction efficiency and greater control over the direction, i.e. radiation pattern, and spectrum of the emitted light. The principal variables of the device structure are the reflectivities of the top and bottom mirrors and the optical thickness of the structure. Generally, the thinner the cavity the fewer the waveguided modes. The light in these modes is trapped in the crystal and lost as heat. Shutting off this recombination process leaves more electron-hole pairs available for generation of usable light that is light generated within the escape cone of the crystal. Thus the wafers are processed as thin as possible, less than 1 μm, consistent with good device yield and adequate current spreading. In many embodiments, the thickness of the epitaxial layers 20 that form the resonant cavity is less than about 1 μm, often between about 0.5 and about 0.7 μm.

For devices with typical spectral width less than about 140 meV, the extraction efficiency of the generated light may be increased by fine tuning the cavity thickness. Internal to the crystal, the angle of the generated light is a sensitive function of wavelength and cavity thickness. The radiation pattern may be fitted to the escape cone of the crystal, i.e. less than 25° from normal, by careful selection of cavity thickness. Therefore within the less than 1 μm thickness requirement stated above is an additional requirement that the optical thickness across the device corresponds to a desired resonance to optimize the extraction efficiency or surface brightness. Typically a resonance requires control to within 15 nn, e.g. 570+/−15 nm or 675+/−15 nm thickness.

Figure 17:
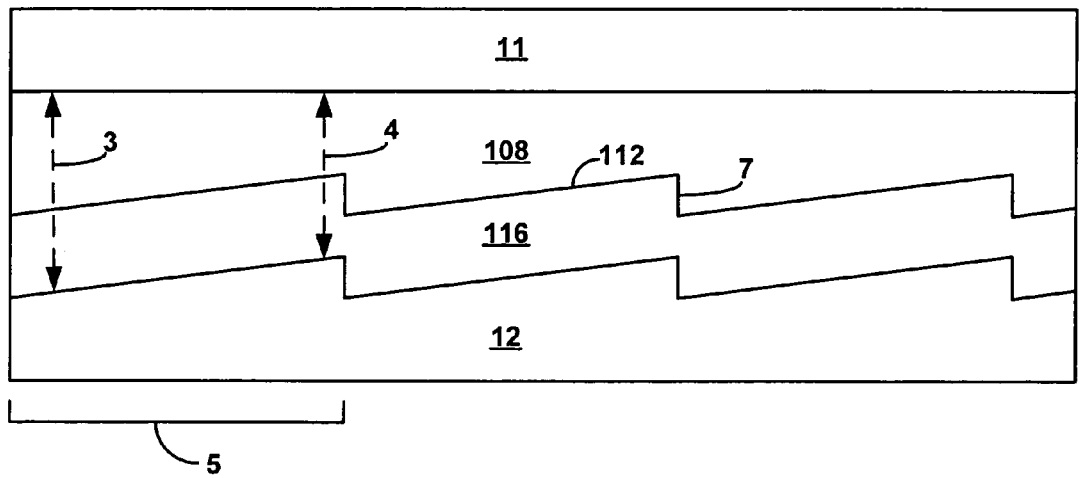
FIG. 17 illustrates a portion of a resonant cavity device formed by chemical mechanical polishing.

In order to achieve the desired cavity thickness, the epitaxial layers are generally thinned after growth to the desired cavity thickness. The epitaxial layer may be thinned by conventional etching processes or chemical mechanical polishing. FIG. 17 illustrates a portion of a device where the cavity is thinned by chemical mechanical polishing. Such conventional thinning processes present two problems. First, with conventional processes it can be difficult to control the stopping point of the thinning process with the 15 nm precision required to make an efficient resonant cavity.

Second, due to the lattice mismatch between the growth substrate on which the epitaxial layers are grown and between the epitaxial layers themselves, it is difficult to grow flat III-nitride layers. The presence of crystal defects generally results in III-nitride layers with an uneven surface, as illustrated by active region 112 of FIG. 17. The surfaces of the III-nitride layers may have a cross section including peaks separated by valleys. The "peaks" are slanted crystal planes 5, separated by the "valleys" formed by steps 7 between the individual planes. Planes 5 may be, for example, 1 to 150 microns long, and are often about 100 microns long. Steps 7 may have a height, for example, on the order of about λ/4, where λ is the wavelength in the crystal of light emitted by active region 112. For example, steps 7 may have a height between about 15 nm and about 100 nm. Regions 108, 112, and 116 are thin enough that strain within these regions causes each to have the same peak-and-valley surface, as illustrated at the interfaces between active region 112 and p-type region 116, and between active region 112 and n-type region 108. The conventional thinning processes described above typically result in a flat surface, as illustrated at the interface between n-type region 108 and mirror 11. Accordingly, forming a resonant cavity device by conventional processes results in a cavity with one uneven surface (the interface between p-type region 116 and p-contact 12, resulting from growth) and one flat surface (the interface between n-type region 108 and mirror 11, resulting from etching or chemical mechanical polishing). The difference in the surfaces on either side of the resonant cavity results in variations in the cavity thickness as illustrated by arrows 3 and 4. As a result, only portions of the cavity are appropriately tuned. Such variations can decrease the efficiency of the device.

Figure 18:
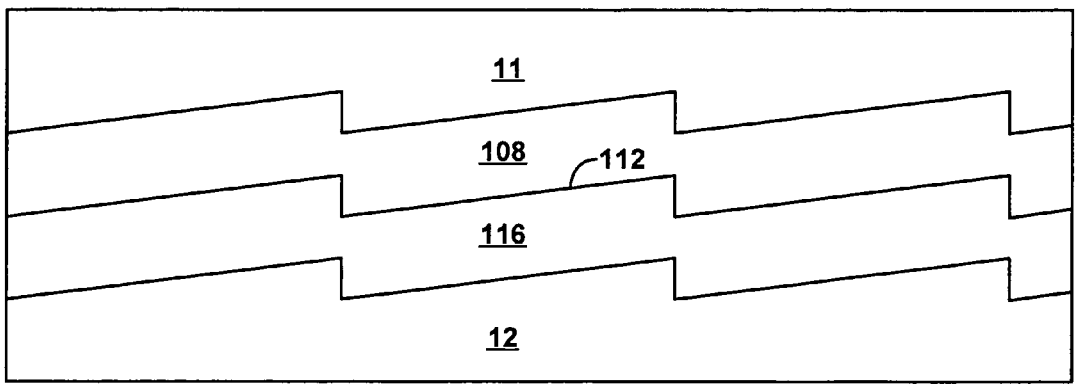
FIG. 18 illustrates a portion of a resonant cavity device formed by photoelectrochemical etching.

In accordance with embodiments of the invention, the thickness of the resonant cavity is kept constant by incorporating an etch stop layer into the epitaxial layers during growth. In order for the etch stop layer to be conformal to the layers that form the resonant cavity, the etch stop layer is grown just before or within one micron of the epitaxial layers forming the cavity. Since the epitaxial layers grown over the etch stop layer are thin, they retain the surface of the etch stop layer, resulting in a constant resonant cavity thickness. The device is thinned by a process that terminates on the etch stop layer, resulting in a cavity with a constant thickness since the top cavity surface is identical to the bottom cavity surface. FIG. 18 illustrates a portion of a device where the cavity is thinned by a process that terminates on an etch stop layer grown before the cavity layers. As illustrated in FIG. 18, both surfaces of the cavity, the interface between n-type region 108 and mirror 11 and the interface between p-type region 116 and p-contact 12, have the same surface shape, resulting in a cavity of constant thickness. In some embodiments, at any point in the cavity, the thickness of the cavity varies less than λ/8 from an average thickness of the cavity, or less than 5% from the average thickness of the cavity.

Figure 3:
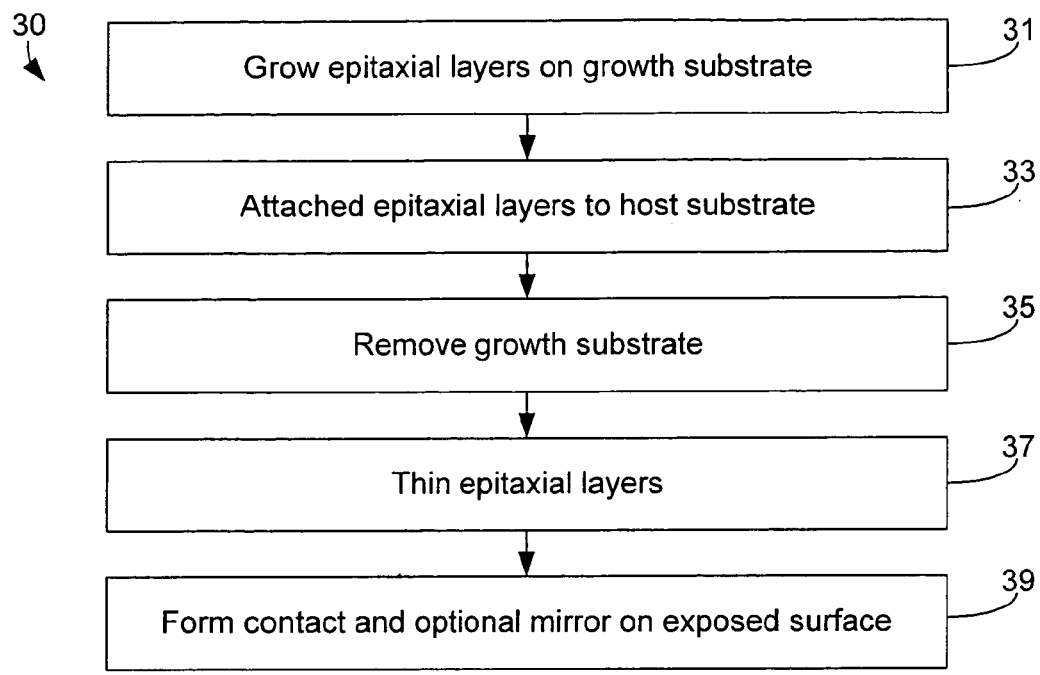
FIG. 3 illustrates a method of fabricating the device of FIGS. 1 and 2.

A device with a constant cavity thickness may be fabricated by the method illustrated in FIG. 3. In stage 31, epitaxial layers 20 are grown on a conventional growth substrate. The epitaxial layers are then attached to a host substrate in stage 33, such that the growth substrate can be removed in stage 35. The epitaxial layers are thinned in stage 37, then a contact and optional mirror are formed on the exposed surface of the epitaxial layers in stage 39.

Figure 4:
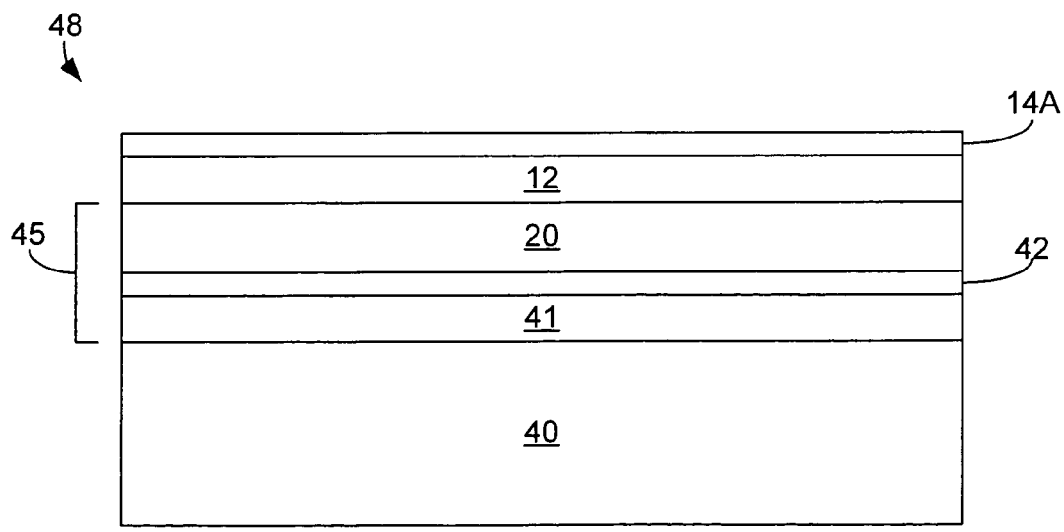
FIG. 4 illustrates an epitaxial structure prior to bonding to a host substrate.

FIG. 4 illustrates stage 31 of FIG. 3 in more detail. Epitaxial layers 20 of the device of FIG. 1 are grown on a substrate 40 such as sapphire, SiC, or GaN. Optional preparation layers 41, which may include, for example, buffer layers or nucleation layers, may be grown first on substrate 40 to provide a suitable growth substrate. One or more etch-stop layers 42 may then be grown. The epitaxial layers 20 are then grown to the desired cavity thickness over etch-stop layer 42. Epitaxial layers 20 include n-type region 108, active region 112, and p-type region 116. Usually, the n-type region is grown first, followed by the active region and the p-type region. A reflective p-contact 12 is formed on the surface of p-type region 116. P-contact 12 may be a single layer or may include multiple layers such as an adhesion layer, an ohmic contact layer, a reflective layer, and a guard metal layer. The reflective layer is usually silver or aluminum. The guard metal may include, for example, nickel, titanium, or tungsten. The guard metal may be chosen to prevent the reflective metal layer from migrating, particularly in the case of a silver reflective layer, and to provide an adhesion layer for a bonding layer 14A, used to bond the epitaxial structure to a host substrate.

Figure 5:
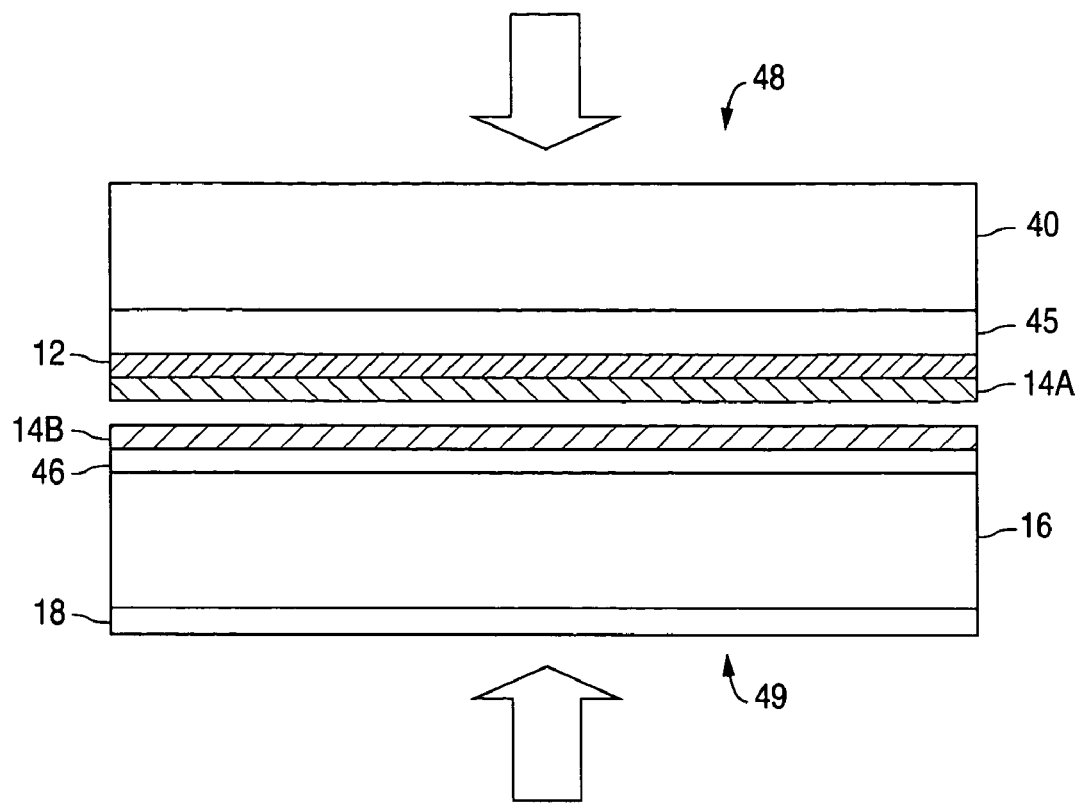
FIG. 5 illustrates a method of bonding an epitaxial structure to a host substrate.

FIG. 5 illustrates stage 33 of FIG. 3, attaching the epitaxial layers to a host substrate, in more detail. Bonding layers 14A and 14B, typically metal, serve as compliant materials for thermo-compression bonding between the epitaxial structure and the host substrate. Examples of suitable bonding layer metals include gold and silver. If silver is used, the guard metal in p-contact 12 may be eliminated. Alternatively 14A and 14B can be a mixture of metals such that when bonding at elevated temperatures, the eutectic temperature is met, and 14A and 14B melt while bonding. Host substrate 16 provides mechanical support to the epitaxial layers after the growth substrate is removed, and provides electrical contact to p-contact 12. Host substrate 16 is selected to be electrically conductive (i.e. less than about 0.1 Ωcm), to be thermally conductive, to have a coefficient of thermal expansion (CTE) matched to that of the epitaxial layers, and to be flat (i.e. with an RMS roughness less than about 100 nm) enough to form a strong wafer bond. Suitable materials include, for example, metals such as thin Cu foil, Mo, Cu/Mo, and Cu/W; semiconductors with metal contacts (layers 46 and 18 of FIG. 6), such as Si with ohmic contacts and GaAs with ohmic contacts including, for example, one or more of Pd, Ge, Ti, Au, Ni, Ag; and composite metal-ceramics such as AlSiC or cobalt diamond. Table 1 below lists the properties of some suitable host substrates, as well as the properties of GaN and $Al_2O_3$ for comparison:

| Material | CTE ($10^{-6}$/K) | Thermal conductivity (W/m K) | Electrical resistance (Ωcm) |
| --- | --- | --- | --- |
| GaN | 4.8 | 130 | 0.01 |
| $Al_2O_3$ | 6.8 | 40 | Very high |
| Si | 2.7 | 150 | 0.01 plus contact resistance |
| GaAs | 5.7 | 59 | 0.01 plus contact resistance |
| Mo | 4.8 | 140 | $5 \times 10^{-6}$ |

Host substrate structure 49 and epitaxial structure 48 are pressed together at elevated temperature and pressure to form a durable metal bond between bonding layers 14A and 14B. In some embodiments, bonding is done on a wafer scale, before a wafer with an epitaxial structure is diced into individual devices. The temperature and pressure ranges for bonding are limited on the lower end by the strength of the resulting bond, and on the higher end by the stability of the host substrate structure and the epitaxial structure and CTE mismatch. For example, high temperatures and/or high pressures can cause decomposition of the epitaxial layers in structure 48, delamination of p-contact 12, failure of diffusion barriers, for example in p-contact 12, outgassing of the component materials in the epitaxial layers, and wafer bowing. A suitable temperature range is, for example, about 200° C. to about 500° C. A suitable pressure range is, for example, about 100 psi to about 300 psi.

Figure 6:
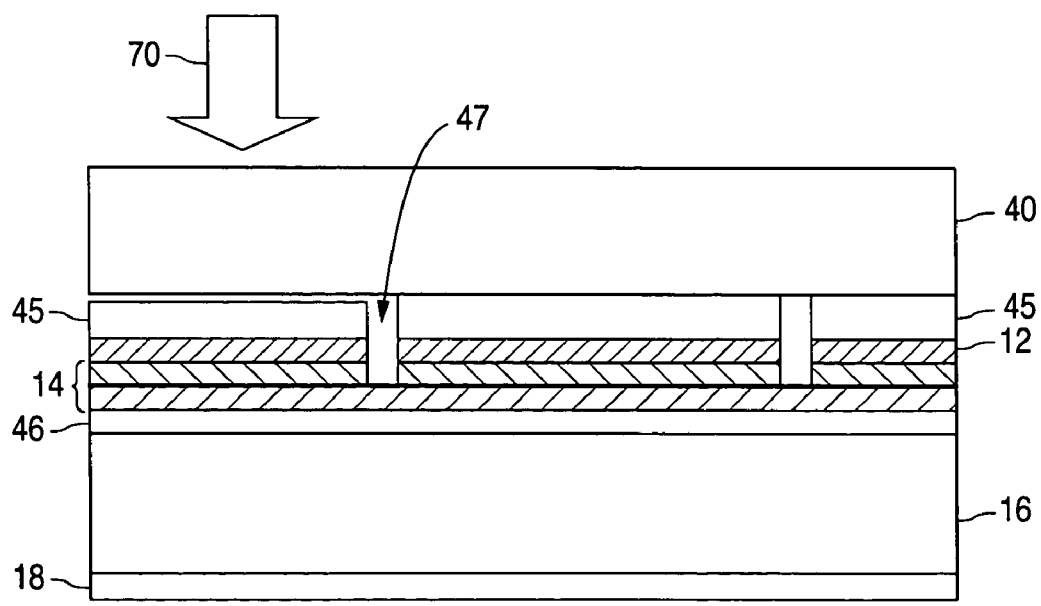
FIG. 6 illustrates a method of removing a sapphire substrate from a III-nitride epitaxial structure.

FIG. 6 illustrates a method of removing a sapphire growth substrate, stage 35 in FIG. 3. Portions of the interface between sapphire substrate 40 and the III-nitride layers 45 are exposed, through the sapphire substrate, to a high fluence ultraviolet laser 70 pulsed in a step and repeat pattern, or fired synchronously with continuous motion. The photon energy of the laser is above the band gap of the III-nitride layer adjacent to the sapphire (GaN in some embodiments), thus the pulse energy is effectively converted to thermal energy within the first 100 nm of epitaxial material adjacent to the sapphire. At sufficiently high fluence (i.e. greater than about 1.5 $J/cm^2$) and a photon energy above the band gap of GaN and below the absorption edge of sapphire (i.e. between about 3.44 and about 6 eV), the temperature within the first 100 nm rises on a nanosecond scale to a temperature greater than 1000° C., high enough for the GaN to dissociate into gallium and nitrogen gasses, releasing the epitaxial layers 45 from substrate 40. The resulting structure includes epitaxial layers 45 bonded to host substrate structure 49.

Exposure to the laser pulse results in large temperature gradients and mechanical shock waves traveling outward from the exposed region, resulting in thermal and mechanical stress within the epitaxial material sufficient to cause cracking of the epitaxial material and failure of wafer bond 14, which limits the yield of the substrate removal process. The damage caused by thermal and mechanical stresses may be reduced by patterning the epitaxial structure down to the sapphire substrate or down to a suitable depth of the epitaxial structure, to form trenches between individual devices on the wafer. The trenches are formed by conventional masking and dry etching techniques, before the wafer is bonded to the host substrate structure. The laser exposure region is then matched to the pattern of trenches on the wafer. The trench isolates the impact of the laser pulse to the semiconductor region being exposed and provides a preferred path for stress relaxation.

Figure 16:
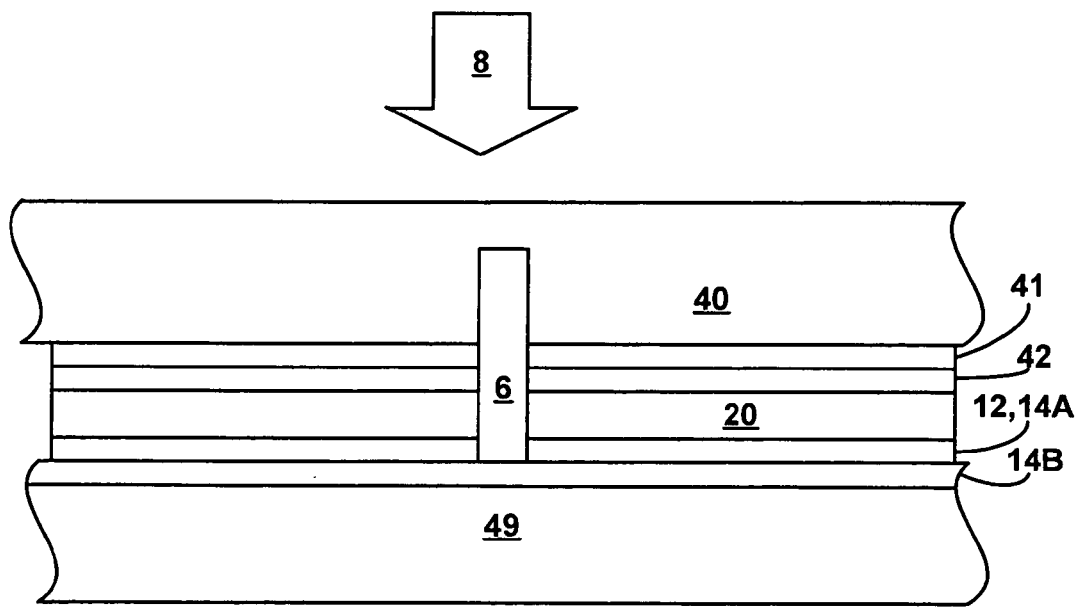
FIG. 16 illustrates substrate removal by photoelectrochemical etching.

As an alternative to laser lift off as described above, a sapphire substrate or other suitable substrate may be removed by photoelectrochemical etching. Substrate removal by photoelectrochemical etching is illustrated in FIG. 16. After growth of epitaxial layers 20 on growth substrate 40, trenches 6 may be formed in the epitaxial layers of the device and a portion of substrate 40 (for example, the 30 microns of substrate 40 closest to the epitaxial layers) by laser scribing as is known in the art, or any other suitable technique. The epitaxial layers are then bonded to host substrate structure 49 through p-contact 12 and bonding layers 14A and 14B. Growth substrate 40 may then be thinned by conventional means such as grinding to expose the trench 6 to ambient. The structure is immersed in a solution suitable for photoelectrochemical etching that flows into trenches 6, and the structure is exposed through substrate 40 to light 8 with an energy greater than the band gap of sacrificial layer 41. Exposure to the light generates electron-hole pairs in sacrificial layer 41, which break the bonds of sacrificial layer 41, undercutting and releasing substrate 40 from the epitaxial structure. The epitaxial structure may include an etch-stop layer 42, which terminates the photoelectrochemical etch. Further details of photoelectrochemical etching and suitable etch stop layers 42 are described below in reference to FIG. 7.

Figure 15:
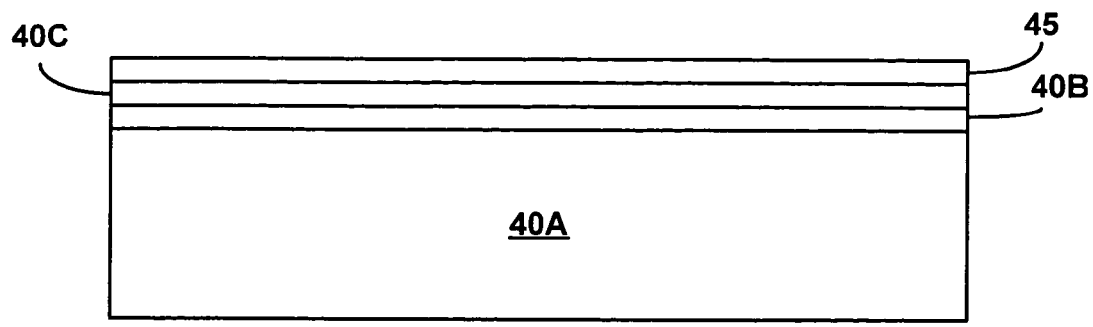
FIG. 15 illustrates a substrate that may be removed by chemical etching.

Growth substrates other than sapphire may be removed with ordinary chemical etchants, and thus may not require the laser exposure substrate removal procedure described above. FIG. 15 illustrates an example of a substrate 40 that may be removed by chemical etching. Substrate 40 of FIG. 15 includes a SiC layer 40C grown or processed onto a Si base 40A. An optional $SiO_x$ layer 41B may be disposed between base 40A and SiC layer 40C. Si base layer 40A and oxide layer 40B may be easily removed by conventional silicon processing techniques. SiC layer 40C may be thin enough, for example, less than 0.5 $\mu$m thick, to be removed entirely by known dry etching or abrasive techniques. P-contact 12 may then be formed on the exposed surface of epitaxial layers 45. Alternatively, p-contact 12 may be formed in holes etched in SiC layer 40C.

Figure 7:
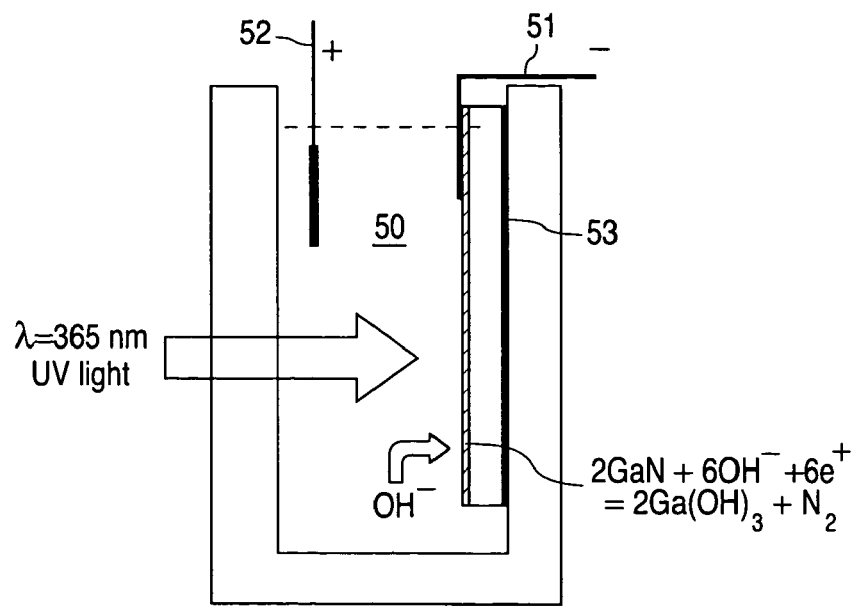
FIG. 7 illustrates photoelectrochemical etching to thin the epitaxial layers after growth substrate removal.

After the growth substrate is removed, the remaining epitaxial layers are thinned to the etch stop layer 42 by, for example, photoelectrochemical etching (PEC) as illustrated in FIG. 7. The host substrate and epitaxial layers (structure 53) are immersed in a basic solution 50. An example of a suitable basic solution is 0.2 M KOH, though many other suitable basic or acidic solutions may be used and depend on the composition of the material to be etched and the desired surface texture. The epitaxial surface of structure 53, generally an n-type GaN layer, is exposed to light with energy greater than the band gap of the surface layer. In the example illustrated in FIG. 7, ultraviolet light with a wavelength of about 365 nm and an intensity between about 10 and about 100 mW/cm$^2$ is used. Exposure to the light generates electron-hole pairs in the surface semiconductor layer. The holes migrate to the surface of the epitaxial layers under the influence of the electric field in the n-type semiconductor. The holes then react with the GaN at the surface and basic solution 50 to break the GaN bonds, according to the equation $2GaN+6OH^-+6e^+=2Ga(OH)_3+N_2$. An external electric potential may be applied across electrodes 51 and 52 to accelerate and control the etching process.

The etch stop layer may have a composition selected for a band gap greater than that of the layer to be etched. For example, the etched layer may be GaN, and the etch stop layer may be AlGaN. The light source used to expose structure 53 is selected to have an energy greater than the band gap of the layer to be etched, but less than the band gap of the etch stop layer. Accordingly, exposure to the light does not generate electron-hole pairs in the etch stop layer, effectively halting the etch once the etch stop layer is reached. In some embodiments, InGaN may be used as the etch stop layer. Indium oxide, formed as the InGaN decomposes, is insoluble in the etchant solution and coats the surface of the etched layer, terminating the etch. After thinning, the etch stop layer may optionally be removed, for example, by continuing photoelectrochemical etching with light of a different energy in the case of an AlGaN etch stop layer, or by agitating the solution to disturb the indium oxide coating the surface of the etched layer in the case of an InGaN etch stop layer.

In embodiments where a substrate is removed by photoelectrochemical etching then thinned by photoelectrochemical etching, the device may include multiple etch stop layers, a first etch stop layer close to the growth substrate to control the etch during growth substrate removal, and a second etch stop layer close to the active region to control the etch during thinning. In some embodiments, the growth substrate is removed by photoelectrochemical etching, then a portion of n-type region 108 is removed by a conventional etch, such as a reactive ion etch. The resonant cavity is formed by further thinning n-type region 108 in a second photoelectrochemical etch.

Though the embodiment illustrated in FIG. 1 shows a uniformly thick n-type region, in some embodiments a three dimensional structure may be formed on n-type region 108 during thinning. For example, n-type region 108 may be patterned such that the portion under contact 10 is thicker than the portion under mirror 11, in order to minimize the thickness of the cavity, while providing enough n-type material under contact 10 for adequate current spreading, optimal contact resistance, and mechanical strength. Such a structure also permits testing during pauses in the etching process to check for optimum etch depth based on reflectivity and radiometric measurements of output light.

After thinning the epitaxial layers, contact 10 and mirror 11 are deposited on the exposed surface of epitaxial structure 20. If mirror 11 is not conductive (a dielectric DBR for example), an optional current spreading layer 70 of, for example, conductive indium tin oxide or a heavily doped III-nitride material may be included between mirror 11 and n-type region 108 in order to spread current from contact 10 under mirror 11. The current spreading layer may be contacted by removing portions of mirror 11 down to the current spreading layer to create channels and extending contact 10 into the channel or depositing an additional conductive material in the channels that makes electrical contact with contact 10.

Figure 8:
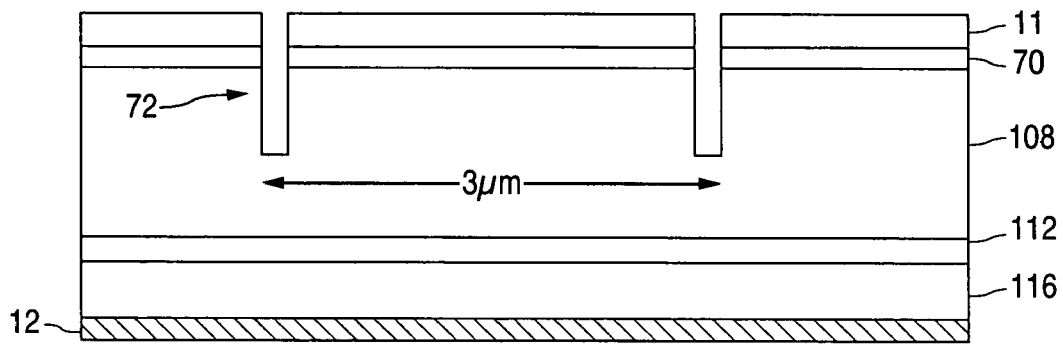
FIG. 8 illustrates an embodiment of the present invention including trenches formed in the n-type region of the device.
Figure 9:
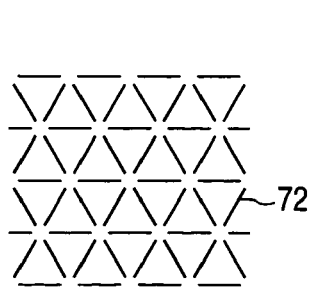
FIGS. 9, 10, and 11 illustrate examples of arrangement of the etch vias of FIG. 8.
Figure 10:
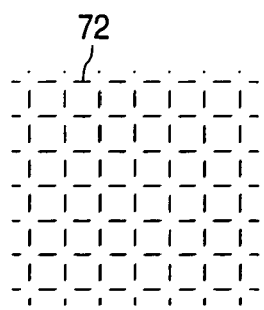
Figure 11:
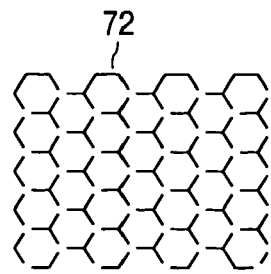

FIG. 8 is a cross sectional view of a portion of a resonant cavity device including trenches, according embodiments of the invention. Etch vias 72 are etched through DBR 11 into n-type region 108 in order to interrupt the waveguide at the interface of n-type region 108 and DBR 1. Etch vias 72 may thus enhance extraction from the device by limiting the number of modes in the device. Etch vias 72 are typically confined to n-type region 108 and generally do not extend into active region 112. Etch vias 72 may have a depth between about 0.1 $\mu$m and about 2.5 $\mu$m and may be spaced about 1 $\mu$m to about 10 $\mu$m apart. A usual distance between two adjacent trenches is about 3 $\mu$m. Trenches 72 may form a pattern of broken lines to facilitate current spreading in the etched layer. FIGS. 9, 10, and 11 illustrate examples of patterns of trenches 72. Trenches 72 may be formed by conventional etching steps after depositing mirror 11.

Figure 12:
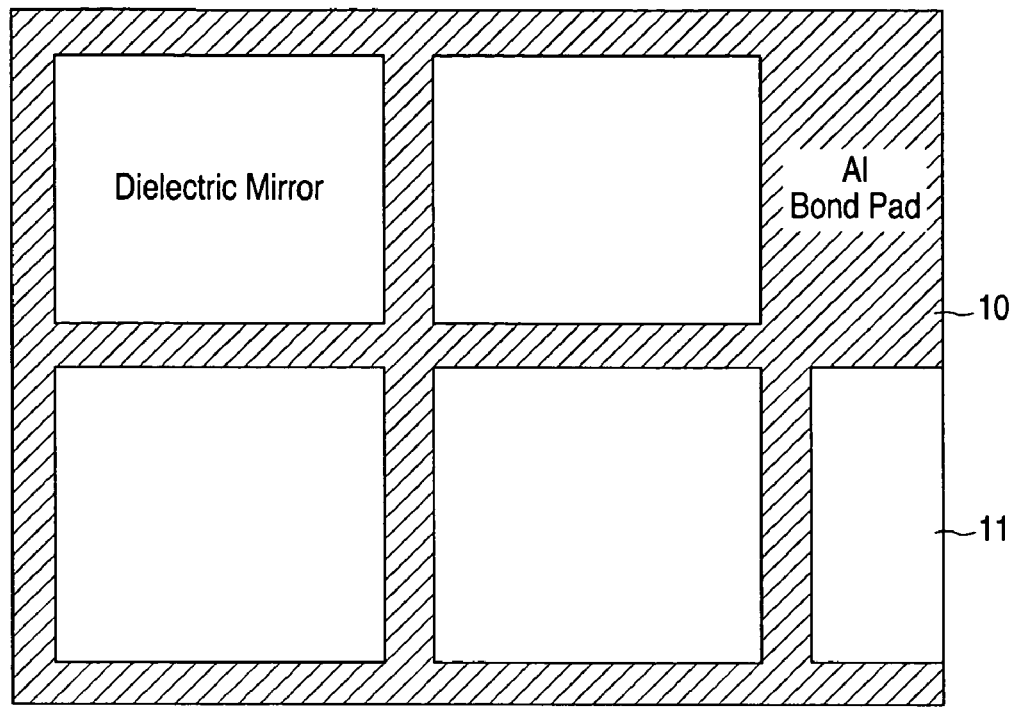
FIG. 12 is a plan view of an alternate embodiment of the present invention.
Figure 13:
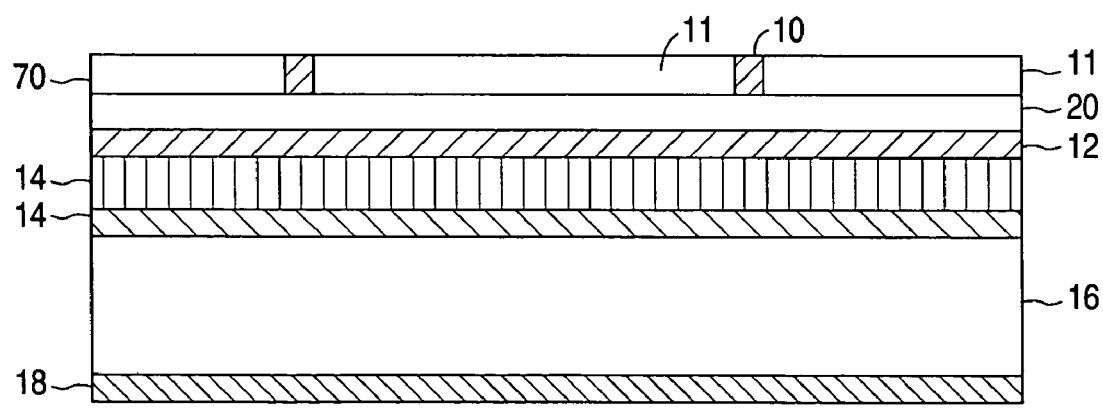
FIG. 13 is a cross sectional view of the device of FIG. 12.

In some embodiments of the invention, DBR 11 on the surface of n-type region 108 is divided into multiple regions separated by metal contacts, instead of a single DBR 11, as illustrated in FIG. 1. FIGS. 12 and 13 are a plan view and a cross sectional view of a portion of such a device. Each region of DBR 11 may be, for example, about 50 $\mu$m to about 150 $\mu$m across. Though the regions shown are square, other shapes may be used. Each DBR region is separated by, for example, about 1 $\mu$m to about 10 $\mu$m. The areas between DBR regions 11 are filled with n-contact 10. In some embodiments, an optional current spreading layer 70, which may be, for example, indium tin oxide or RuO, is disposed between n-type region 108 and DBR regions 11 and n-contact regions 11. Current injection in the regions of epitaxial layers 20 beneath n-contacts 10 may be blocked by hydrogen implantation as described above, in order to confine light emission to the areas underlying DBR regions 11.

Figure 14:
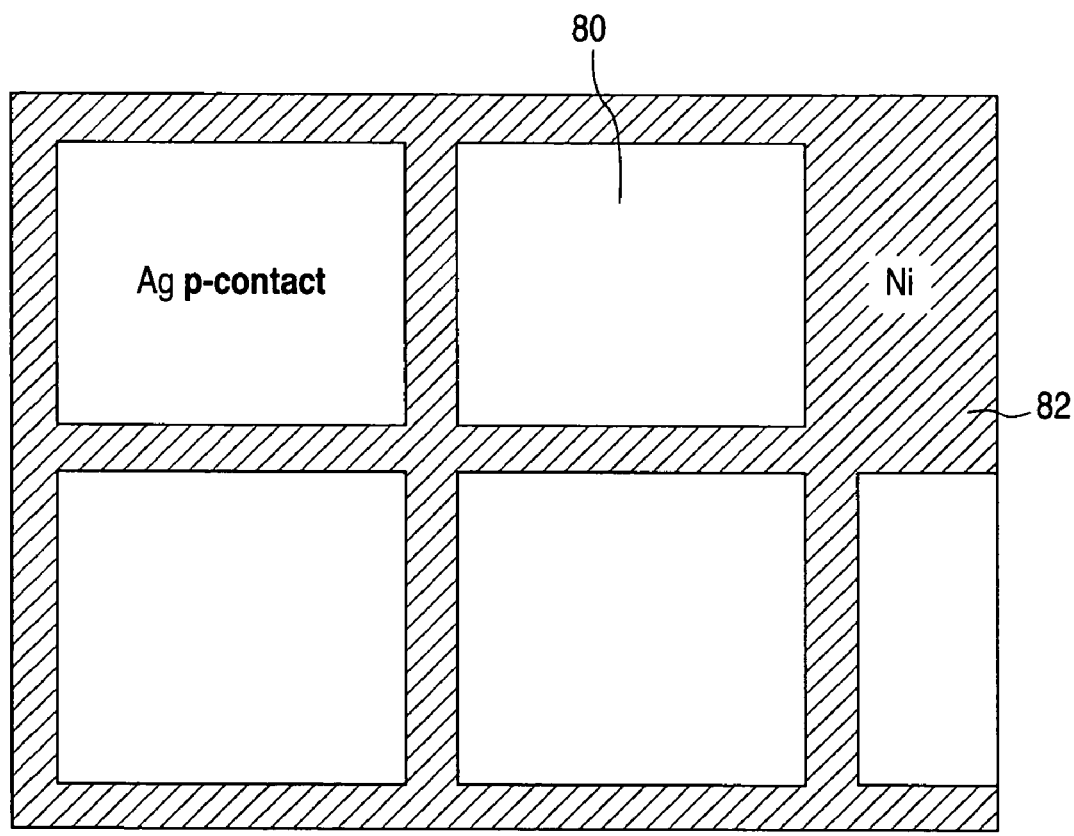
FIG. 14 is a cutaway plan view of a p-contact.

In the device illustrated in FIGS. 12 and 13, p-contact 12 may be a single, continuous reflective sheet, as illustrated in FIG. 13, or may have regions of high reflectivity opposite DBR regions 11. FIG. 14 is a cutaway plan view of a p-contact 12. Mirror regions 80 are aligned with DBR regions 11, illustrated in FIG. 12. Mirror regions 80 are optimized for high reflectivity and are separated by contact regions 82, which may be optimized for good adhesion. Mirror regions 80 may be, for example, silver, and contact regions 82 may be, for example, nickel.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A III-nitride light emitting device comprising:
   an n-type region;
   a p-type region; and
   a light emitting region disposed between the n-type region and the p-type region;
   wherein the n-type region, p-type region, and light emitting region form a cavity, the cavity having a top surface and a bottom surface, wherein each of the top surface and the bottom surface comprise a plurality of peaks separated by a plurality of valleys.

2. The device of claim 1 wherein a distance between a bottom of a valley and a top of a peak is between 15 nm and 100 nm.

3. The device of claim 1 wherein a distance between two nearest neighbor valleys is less than 100 microns.

4. The device of claim 1 wherein a thickness of the cavity at any point in the cavity varies less than $\lambda/8$, where $\lambda$ is a wavelength, in the cavity, of light emitted by the light emitting region.

5. The device of claim 1 further comprising:
   a first mirror disposed proximate to the n-type region; and
   a second mirror disposed proximate to the p-type region.

6. The device of claim 5 wherein the first mirror comprises a dielectric distributed Bragg reflector.

7. The device of claim 5 wherein the second mirror comprises a reflective metal layer.

8. The device of claim 7 wherein the second mirror comprises silver.

9. The device of claim 5 wherein the second mirror comprises a dielectric distributed Bragg reflector.

10. The device of claim 5 wherein the first mirror is divided into a plurality of regions and the regions are separated from each other by a first contact.

11. The device of claim 10 wherein:
    the second mirror is divided into a plurality of regions and the regions are separated from each other by a second contact; and
    the plurality of first mirror regions are aligned with the plurality of second mirror regions.

12. The device of claim 11 wherein a portion of the n-type region between the first contact and the second contact is implanted with hydrogen.

13. The device of claim 10 wherein each region in the plurality of regions has a length between about 50 microns and about 150 microns.

14. The device of claim 10 wherein a width of the first contact separating the regions is between about 1 micron and about 10 microns.

15. The device of claim 5 where at least a portion of the first mirror overlies at least a portion of the second mirror.

16. The device of claim 5 further comprising a layer of conductive material disposed between the n-type region and the first mirror.

17. The device of claim 16 wherein the conductive material comprises indium tin oxide.

18. The device of claim 1 wherein the thickness of material between the top surface and the bottom surface is less than three microns.

19. The device of claim 1 wherein the thickness of material between the top surface and the bottom surface is less than one micron.

20. The device of claim 1 wherein the thickness of material between the top surface and the bottom surface is less than half a micron.

21. The device of claim 1 further comprising a plurality of etch vias formed in the n-type region.

22. The device of claim 21 wherein the etch vias are spaced between about 0.1 micron and about 2 microns apart.

23. The device of claim 21 wherein the etch vias each have a depth between about 0.1 micron and about 2.5 microns.

24. The device of claim 1 wherein the top surface and the bottom surface form a resonant cavity and an electric field intensity in the cavity forms a standing wave.

25. The device of claim 24 wherein at least a portion of the light emitting region is located near a maximum in the electric field intensity.

\* \* \* \* \*